(12) United States Patent
Egelmeers et al.

(10) Patent No.: US 7,058,185 B1
(45) Date of Patent: Jun. 6, 2006

(54) ACOUSTIC ECHO AND NOISE CANCELLATION

(75) Inventors: Gerardus Paul Maria Egelmeers, Eindhoven (NL); Cornelis Pieter Janse, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 1049 days.

(21) Appl. No.: 09/598,732

(22) Filed: Jun. 21, 2000

(30) Foreign Application Priority Data

Jun. 24, 1999 (EP) .................................. 99202026
Mar. 30, 2000 (EP) .................................. 00201142

(51) Int. Cl.
*H04B 15/00* (2006.01)

(52) U.S. Cl. ..................... 381/93; 381/66; 379/406.08; 708/322

(58) Field of Classification Search ................. 381/66, 381/93; 708/321, 322; 379/406.08, 406.12, 379/406.13
See application file for complete search history.

(56) References Cited

U.S. PATENT DOCUMENTS

| | | | |
|---|---|---|---|
| 4,355,368 A | * | 10/1982 | Zeidler et al. .............. 708/322 |
| 4,903,247 A | | 2/1990 | Van Gerwen et al. |
| 4,939,685 A | * | 7/1990 | Feintuch .................... 708/322 |
| 5,828,756 A | | 10/1998 | Benesty et al. |
| 5,987,143 A | * | 11/1999 | Okuno et al. ................. 381/66 |
| 6,246,760 B1 | * | 6/2001 | Makino et al. ........ 379/406.08 |
| 6,546,099 B1 | | 4/2003 | Janse |

FOREIGN PATENT DOCUMENTS

WO          WO9745995          12/1997

OTHER PUBLICATIONS

"Real Time Realization Concepts of large Adaptive filters" Ph.D. G.P.M. Egelmeers, thesis, Einhdoven University of Technology, Eindhoven (The Netherlands), Nov. 1995.
John J. Shynk, "Frequency-domain and Multirate Adaptive Filtering", IEEE SP Magazine, Jan. 1992, pp. 15-37.

* cited by examiner

*Primary Examiner*—Ping Lee
(74) *Attorney, Agent, or Firm*—Edward W. Goodman (57) ABSTRACT

Stereo echo cancellation is necessary to overcome the objections observed by, for example, teleconferencing, voice controlled video/audio apparatuses, etc. To improve the existing filters, an adaptive filter is used along with a signal processing device which obtain the coefficient updates in the transformed domain, reducing the required calculation complexity. Further, the filter includes circuitry for reducing the correlation between the input signals on the coefficient updates.

11 Claims, 8 Drawing Sheets

ACOUSTIC ECHO AND NOISE CANCELLATION

BACKGROUND OF THE INVENTION

1. Field of the Invention

The invention relates to a filter comprising at least two inputs for receiving at least two signals, and an output for supplying an output signal.

The invention further relates to a signal processing device comprising such a filter.

The invention further relates to a teleconferencing system, a voice-controlled electronic device, and a noise cancellation system.

The invention further relates to a method for filtering at least two signals and for supplying an output signal.

Recent developments in audio and video systems require the use of multiple channel processing and reproduction with acoustic echo cancellers (AEC) and noise cancellers. For example in mini-group video conferencing systems, multiple channel transmission leads to a better "localization" of the diverse people in the room. This enhances the intelligibility and naturalness of the speech.

Further, multiple channel echo cancellation is needed in voice-controlled stereo audio and video equipment, such as television receivers, radio receivers, CD players, etc.

A multiple channel AEC can, in general, not be created by a simple combination of multiple single channel AEC's.

2. Description of the Related Art

U.S. Pat. No. 5,828,756 discloses a stereophonic communication system, such as a teleconferencing system, which involves selectively reducing the correlation between the individual channel signals of the stereophonic system. Herein, non-linearities are added to the input signals to reduce the correlation. However by adding these non-linearities, audible artifacts in the output signals are introduced. These non-linearities can (sometimes) be accepted in teleconferencing systems but are certainly not acceptable in other applications, such as supplying music, etc.

SUMMARY OF THE INVENTION

It is, inter alia, an object of the invention to provide a filter, which overcomes the objections of the prior art. To this end a first aspect of the invention provides a filter described in the opening paragraph, characterized in that the coefficient updates are determined in a transformed domain, and the filter comprises means for reducing the effect of correlation between the input signals on the coefficient updates.

Herewith, the performance of the adaptive filters is improved without a huge increase in computational complexity.

BRIEF DESCRIPTION OF THE DRAWINGS

The invention and additional features, which may be optionally used to implement the invention to advantage, will be apparent from and elucidated with references to the examples described below, hereinafter and shown in the accompanying drawings, in which.

DESCRIPTION OF THE PREFERRED EMBODIMENTS

In the description, the equations, matrices, etc., are shown as described below. Signals are denoted by lower case characters, constants by upper case. Underlining is used for vectors, lower case for time domain, and upper case for frequency domain. Matrices are denoted by bold face upper case, e.g., I. The dimension is put in superscript (e.g., the B×Q matrix X is given by $\mathbf{X}^{B,Q}$, for a square matrix the second dimension is omitted). Diagonal matrices are denoted by a double underline, e.g., $\underline{\underline{P}}$, with its diagonal denoted as $\underline{\underline{P}}=\text{diag}\{\underline{P}\}$. A subscript i, e.g., $\underline{w}_i$, denotes the i'th version. The k'th element of $\underline{w}$ is given by $(\underline{w})_k$. Finally, appending [k] denotes the time index, $(.)^t$ denotes the transpose, $(.)^*$ denotes the complex conjugate, and $(.)^h$ denotes the Hermitain transpose (complex conjugate transpose).

Figure 1:
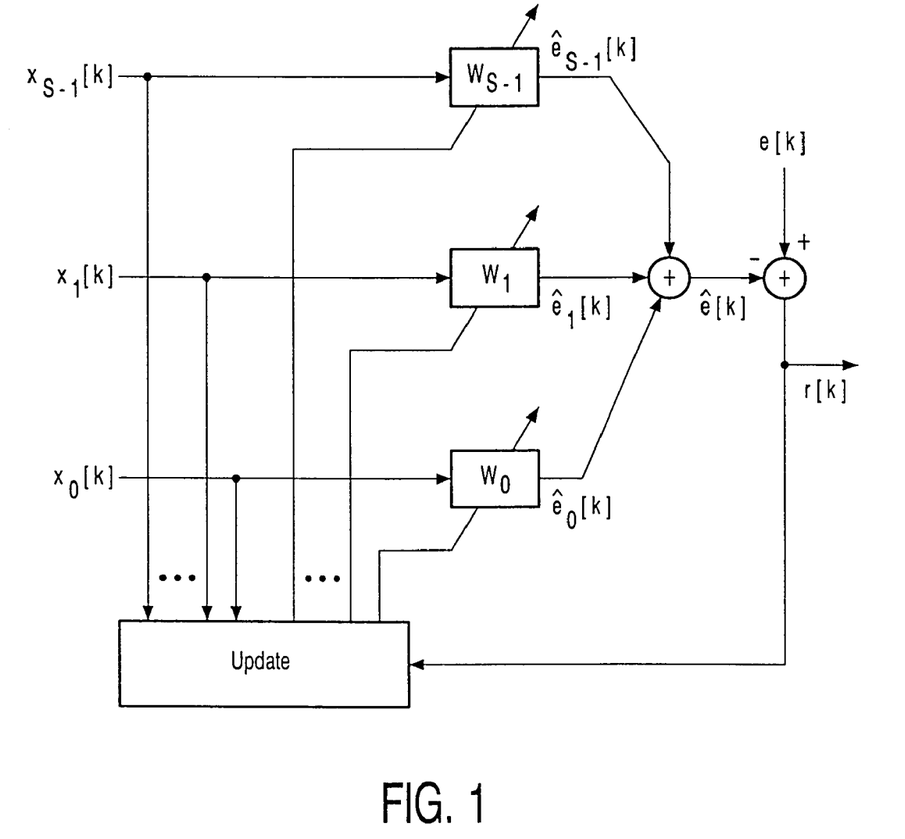
FIG. 1 schematically shows the multiple input adaptive FIR filter, according to the invention.

A general multiple input adaptive FIR filter, depicted in FIG. 1, uses the S signals $x_0[k]$ to $x_{s-1}[k]$ to remove unwanted components correlated with these signals in the signal e[k]. The signals $x_0[k]$ to $x_{s-1}[k]$ are input to S FIR-filters $W_0$ to $W_{s-1}$, with outputs $\hat{e}_0[k]$ to $\hat{e}_{s-1}[k]$. The goal of the update algorithm is to adapt the coefficients of the FIR filters in such a way that the correlation between r[k] and the input signals $x_0[k]$ and $x_{s-1}[k]$ is removed.

For $S>a\geq 0$, the FIR filter $W_a$ performs the convolution of the signal $x_a[k]$ and the coefficients $w_{a,0}[k] \ldots w_{a,N-1}[k]$ of that filter. The output signal $\hat{e}_a[k]$ of such a filter can be described as follows $$\hat{e}_a[k] = \sum_{i=0}^{N-1} x_a[k-i] \cdot w_{a,i}[k] \quad (1)$$
$$= (\underline{x}_a^N[k])^t \cdot \underline{w}_a^N[k]$$

With, for $S>a\geq 0$, $$\underline{x}_a^N[k] = \begin{pmatrix} x_a[k-N+1] \\ \vdots \\ x_a[k-1] \\ x_a[k] \end{pmatrix} \quad (2)$$

-continued $$\underline{w}_a^N[k] = \begin{pmatrix} w_{a,N-1}[k] \\ \vdots \\ w_{a,1}[k] \\ w_{a,0}[k] \end{pmatrix}. \quad (3)$$

The output of the multiple input adaptive filter is given by $$r[k] = e[k] - \sum_{a=0}^{S-1} \hat{e}_a[k]. \quad (4)$$

These filter parts of the separate (adaptive) filters $W_0$ until $W_{S-1}$ can be implemented efficiently in frequency domain with help of partitioning, block processing and Discrete Fourier Transforms (DFTs). A reduction in computational complexity is obtained since the convolutions per sample in the time domain transform to element-wise multiplications per block in the frequency domain. We use block processing with block length B and DFTs of length M, with $M \geq N+B-1$. The transformation of the input signals can be described for $S > a \geq 0$ by $$\underline{X}_a^M[kB] = F^M \cdot \begin{pmatrix} x_a[kB-M+1] \\ \vdots \\ x_a[kB] \end{pmatrix}, \quad (5)$$

where $F^M$ is the M×M Fourier matrix. The (a,b)'th element (for $0 \leq a < M, 0 \leq b < M$) of the Fourier matrix is given by $$(F^M)_{a,b} = e^{\frac{-j2\pi ab}{M}} \quad (6)$$

where $j = \sqrt{-1}$.

The filter can then be computed in the frequency domain, by $$\hat{\underline{e}}[kB] = (0 \ I^B) \sum_{a=0}^{S-1} \underline{X}_a^M[kB]\underline{W}_a^M[kB] \quad (7)$$

$$= \begin{pmatrix} \hat{e}[kB-B+1] \\ \vdots \\ \hat{e}[kB] \end{pmatrix}.$$

Note that the frequency domain filter coefficients are related to the time domain coefficients, for all $S > a \geq 0$ this can be denoted by $$\underline{W}_a^M[l] = F^M \cdot \begin{pmatrix} w_a, 0[l] \\ w_a, 1[l] \\ \vdots \\ w_{a,N-1}[l] \\ 0 \end{pmatrix}. \quad (8)$$

To obtain an efficient implementation, the block length B must be chosen in the same order as the filter length N, which results a large processing delay.

Figure 2:
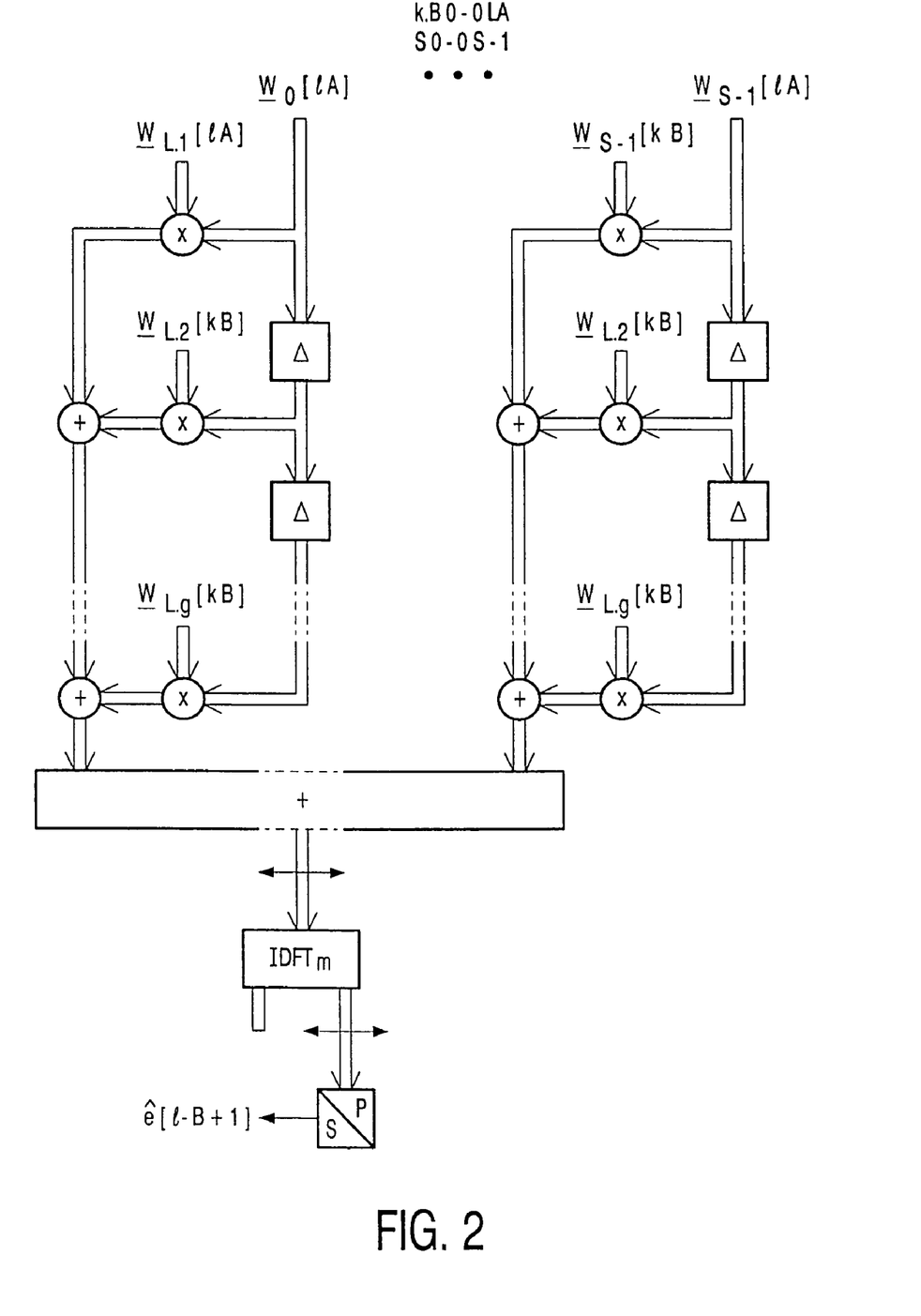
FIG. 2 schematically shows the calculation of the output of the FIR filter, according to the invention.

To reduce the processing delay, the filter can be partitioned into smaller pieces of length B, and with $g = \lceil N/B \rceil$, we get the implementation of FIG. 2, that can be described by $$\hat{\underline{e}}[kB] = (0 \ I^B) \sum_{a=0}^{S-1} \sum_{i=1}^{g} \underline{X}_a^M[(k-i)B]\underline{W}_{a,i}^M[kB] \quad (9)$$

$$\text{with } \underline{W}_{a,i}^M[l] = F^M \cdot \begin{pmatrix} w_{a,iB}[l] \\ w_{a,iB+1}[l] \\ \vdots \\ w_{a,iB+B-1}[l] \\ 0 \end{pmatrix}.$$

For the update part of the filter, one can use S separate update algorithms to improve convergence behavior the input signals can be decorrelated separately in the time domain by using RLS like algorithms, leading to a huge computational complexity. Complexity reduction can be obtained by implementation in the frequency domain with (partitioned) Block Frequency Domain Adaptive Filters, as described in G. P. M. Egelmeers, *Real time realization of large adaptive filters*, Ph.D. thesis, Eindhoven University of Technology, Eindhoven (The Netherlands), November 1995. When there is correlation between the input signals of the filters, this might still lead to very bad convergence behavior, due to the non-uniqueness problem.

In this application, it is proposed to use a partitioned algorithm in the frequency domain that reduces the effect of the cross-correlation between the input signals on the algorithm's convergence behavior. To reduce complexity, block processing, with block length A to compute the sum of A consecutive updates with each iteration, is used. For $S > a \geq 0$, the coefficient vectors $\underline{w}_a^N[lA]$ are partitioned into $g_u$ parts of length Z with $g_u = \lceil N/Z \rceil$ such that, for $S > j \geq 0$ $$\underline{w}_j^N[lA] = \begin{pmatrix} \underline{w}_{j,g_u-1}^Z[lA] \\ \vdots \\ \underline{w}_{j,1}^Z[lA] \\ \underline{w}_{j,0}^Z[lA] \end{pmatrix}$$

with for $S > j \geq 0$ and $g_u > i \geq 0$ $$\underline{w}_{j,i}^Z[lA] = \begin{pmatrix} w_{j,iZ+Z-1}[lA] \\ \vdots \\ w_{j,iZ+1}[lA] \\ w_{j,iZ}[lA] \end{pmatrix}.$$

A Fourier transform length L is used with $L \geq Z+A-1$, we define the input signal Fourier transforms for $S > a \geq 0$ as $$\underline{X}_a^L[lA] = F^L \cdot \underline{x}_a^L[lA] = F^L \begin{pmatrix} x_a[lA-L+1] \\ \vdots \\ x_a[lA-1] \\ x_a[lA] \end{pmatrix}.$$

The diagonal matrices $\underline{X}_a^L[lA]$ contain the vector $X_a^L[lA]$ as main diagonal, so for $S > a \geq 0$ $$\underline{X}_a^L[lA] = \text{diag}\{\underline{X}_a^L[lA]\}.$$

An overlap-save method is used to compute the correlation involved in the adaptation process in the frequency domain, the frequency domain transform of the residual signal vector equals $$\underline{R}^L[lA] = F^L \cdot \begin{pmatrix} 0^{L-A} \\ r^A[lA] \end{pmatrix}.$$

Figure 3:
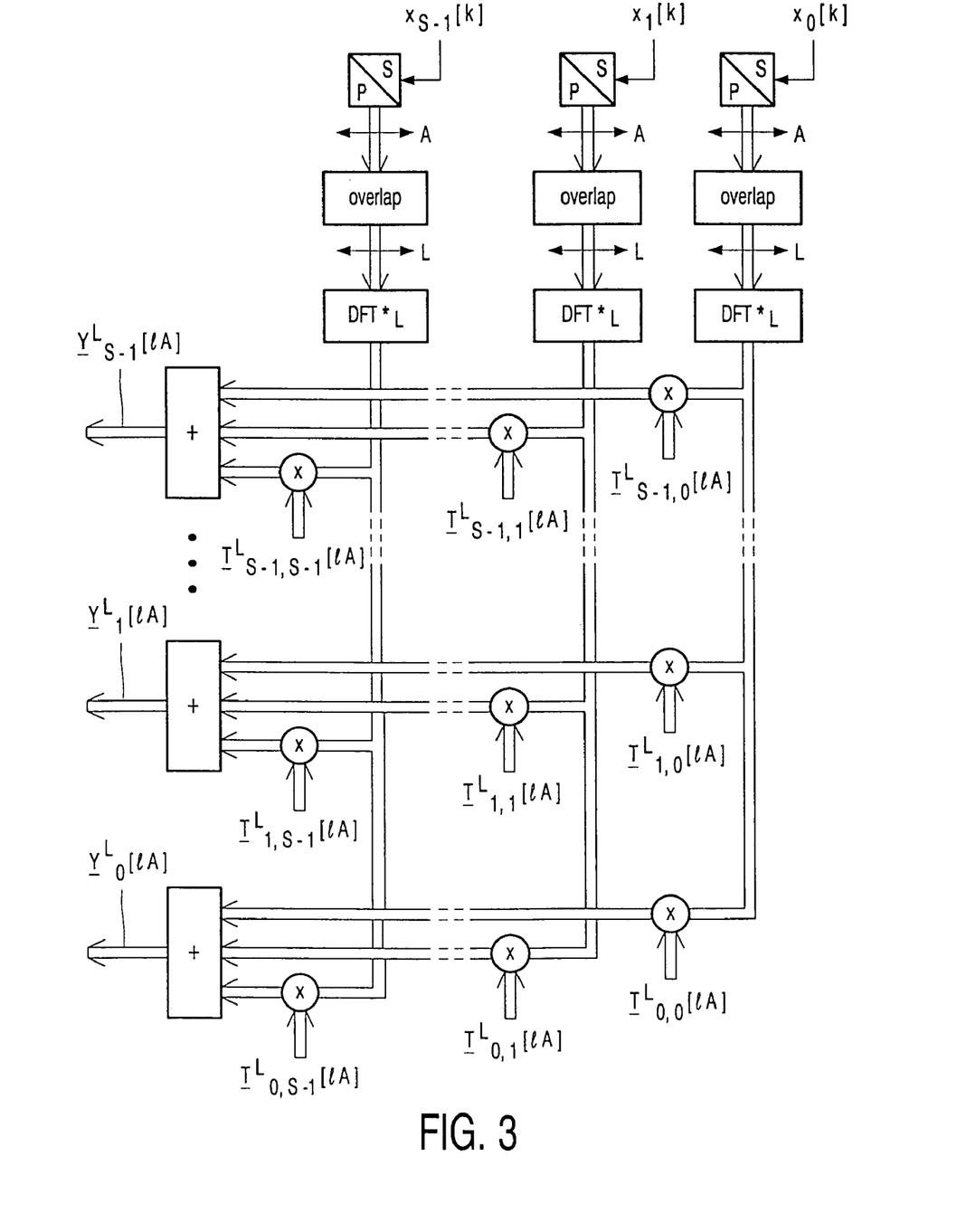
FIG. 3 schematically shows the calculation of Y in the Multiple Input Partitioned Frequency Domain adaptive filter, according to the invention for the case with direct inverse power estimation.
Figure 4:
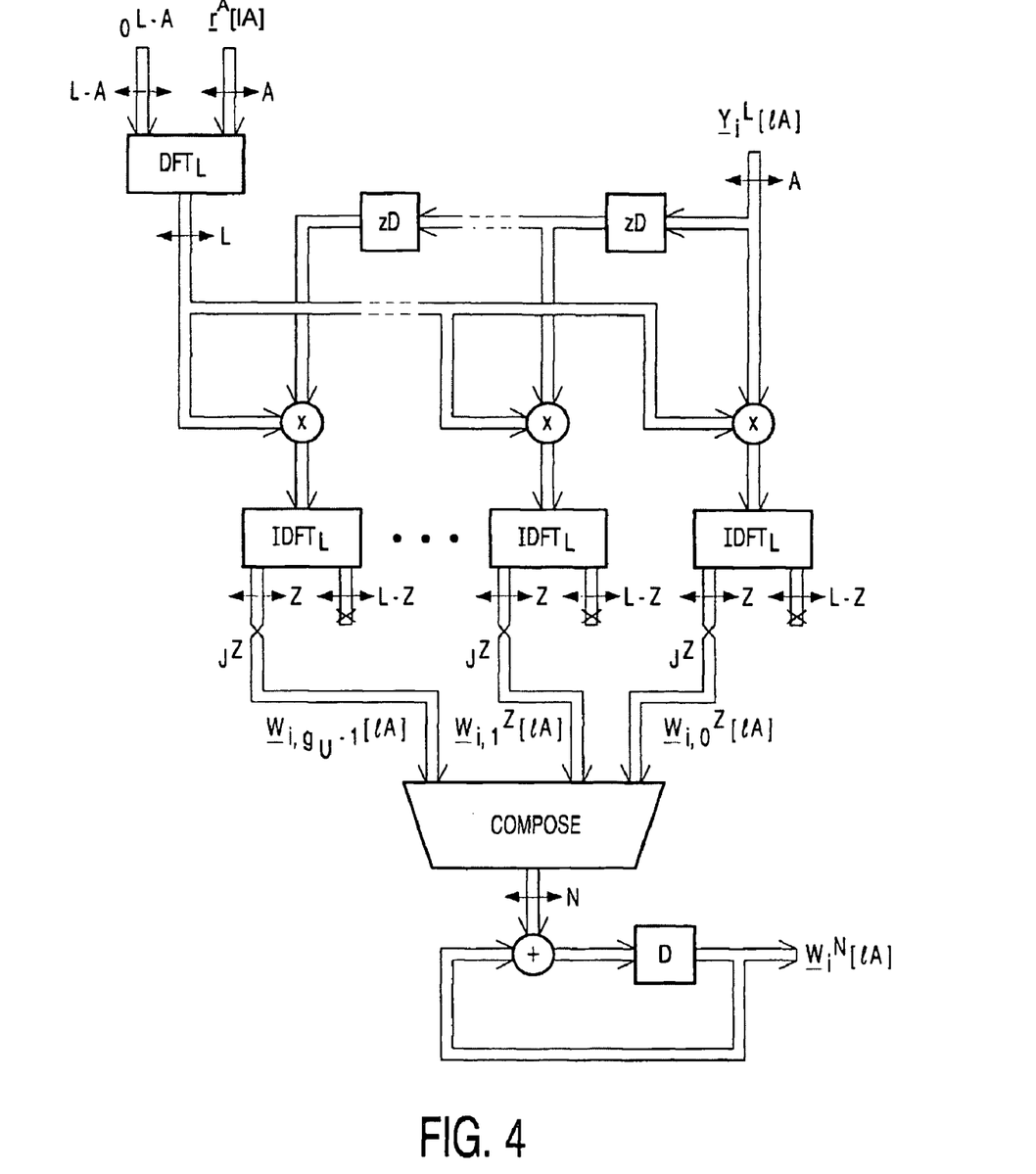
FIG. 4 schematically shows the calculation of the coefficient vectors $\underline{w}_i$ according to the invention.

The set of update equations for the filter coefficients in the MFDAF (Multiple Input Frequency Domain Adaptive Filter) algorithm can now be defined for $g_u > i \geq 0$ by $$\begin{pmatrix} \underline{w}_{S-1,i}^Z[(l+1)A] \\ \vdots \\ \underline{w}_{1,i}^Z[(l+1)A] \\ \underline{w}_{0,i}^Z[(l+1)A] \end{pmatrix} = \begin{pmatrix} \underline{w}_{S-1,i}^Z[lA] \\ \vdots \\ \underline{w}_{1,i}^Z[lA] \\ \underline{w}_{0,i}^Z[lA] \end{pmatrix} + G^{S,Z,S,L} \cdot \begin{pmatrix} (\underline{Y}_{S-1}^L[(lA-iZ)])* \\ \vdots \\ (\underline{Y}_1^L[(lA-iZ)])* \\ (\underline{Y}_0^L[(lA-iZ)])* \end{pmatrix} \cdot \underline{R}^L[lA]$$

with $$\begin{pmatrix} (\underline{Y}_{S-1}^L[lA])* \\ \vdots \\ (\underline{Y}_1^L[lA])* \\ (\underline{Y}_0^L[lA])* \end{pmatrix} = 2\alpha (P^{S,L}[lA])^{-1} \cdot \begin{pmatrix} (\underline{X}_{S-1}^L[lA])* \\ \vdots \\ (\underline{X}_1^L[lA])* \\ (\underline{X}_0^L[lA])* \end{pmatrix}$$

and the transformation matrix $G^{S,Z,S,L}$ is given by $$G^{S,Z,S,L} = \begin{pmatrix} G^{Z,L} & 0^{Z,L} & \cdots & 0^{Z,L} \\ 0^{Z,L} & \ddots & \ddots & \vdots \\ \vdots & \ddots & \ddots & 0^{Z,L} \\ 0^{Z,L} & \cdots & 0^{Z,L} & G^{Z,L} \end{pmatrix}$$

with $$G^{Z,L} = (J^Z 0^{Z,L-Z})(F^L)^{-1}.$$

Figure 9:
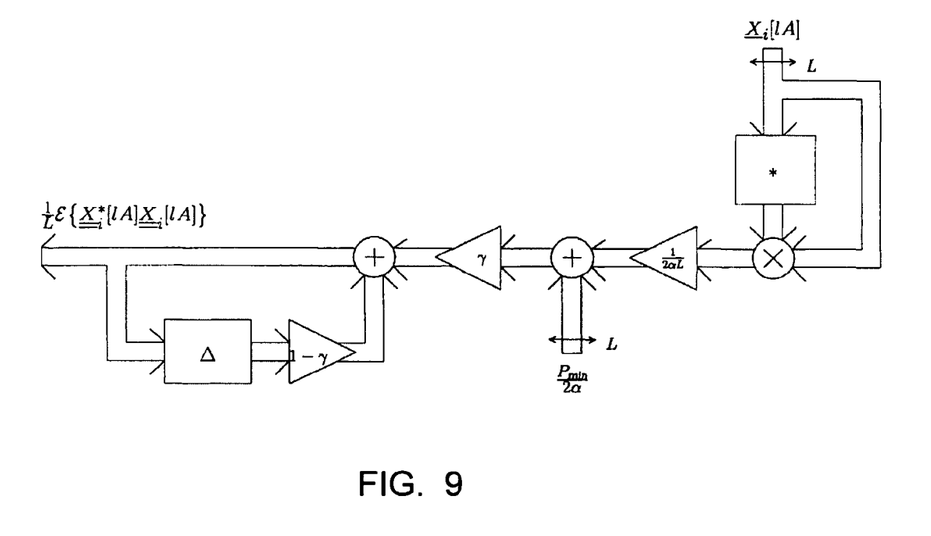
FIG. 9 schematically shows the determining of the input channel's power matrix.

The input channel's power matrix $P^{S,L}[lA]$ is defined by $$P^{S,L}[lA] = \frac{1}{L}\{(X^{S,L,L}[lA]) * \cdot (X^{S,L,L}[lA])^t\}$$

$$= \frac{1}{L} \begin{pmatrix} \varepsilon\{(\underline{X}_{S-1}^L[lA]) * \underline{X}_{S-1}^L[lA]\} & \cdots & \varepsilon\{(\underline{X}_{S-1}^L[lA]) * \underline{X}_0^L[lA]\} \\ \vdots & \ddots & \vdots \\ \varepsilon\{(\underline{X}_0^L[lA]) * \underline{X}_{S-1}^L[lA]\} & \cdots & \varepsilon\{(\underline{X}_0^L[lA]) * \underline{X}_0^L[lA]\} \end{pmatrix}$$

where $$X^{S,L,L}[lA] = \begin{pmatrix} \underline{X}_{S-1}^L[lA] \\ \vdots \\ \underline{X}_1^L[lA] \\ \underline{X}_0^L[lA] \end{pmatrix}.$$

The expectation operator $\varepsilon\{\}$ of the above equation has to be replaced by an estimation routine.

The power matrix $P^{S,L}[lA]$ can be estimated by $$P^{S,L}[lA] = (1-\gamma)P^{S,L}[(l-1)A] + \frac{\gamma}{L}(X^{S,L,L}[lA])^* \cdot (X^{S,L,L}[lA])^t \quad (10)$$

To reduce the number of multiplications, the step-size parameter $\alpha$ of equation is incorporated in the above power estimation routine by defining $$P_\alpha^{S,L}[lA] = \frac{1}{2\alpha} P^{S,L}[lA] \quad (11)$$

so $$2\alpha(P^{SL}[lA])^{-1} = (P_\alpha^{SL}[lA])^{-1} \quad (12)$$

Estimation of the power matrix $P_\alpha^{S,L}[lA]$ can then be done by $$P_\alpha^{S,L}[lA] = \quad (13)$$
$$(1-\gamma) \cdot P_\alpha^{S,L}[(l-1)A] + \frac{\gamma}{2\alpha L} \cdot (X^{S,L,L}[lA])^* \cdot (X^{S,L,L}[lA])^t.$$

Direct application of this algorithm leads to stability problems. When the input signal power in a certain frequency bin is very small, the power in that bin will decrease to a (very) small value. The inverse of the matrix will then have large values and will be inaccurate (due to numerical and estimation errors) In the ideal case, the eigenvalues of the power matrix estimate cancel the eigenvalues of the input signal power matrix. Due to estimation errors, this goal is only approximated, and the mismatch introduces a deviation from the ideal convergence behavior and might even lead to instability. Especially when some of the eigenvalues of the estimate of the inverse power matrix get large, and do not (exactly) cancel a (small) eigenvalue of the input signal power matrix, instability might occur. A lower limit to the eigenvalues of the estimate of the power matrix can solve this problem. In the single channel case (or when we forget the cross-terms), we can solve this problem by applying a lower limit to the lower values. We can do this because the eigenvalues of a diagonal matrix are equal to the elements of the diagonal, so we actually limit the eigenvalues. In the multiple channel case we also have to limit the eigenvalues to assure stability, but these no longer equal the elements on the diagonal.

We know, however, that all eigenvalues of the power matrix are positive. We can now create a lower limit on the eigenvalues by shifting them by the suggested minimum. We know that for all eigenvalues $\lambda$ of a matrix A, the determinant of $A+(P_{min}-\lambda')\cdot I$ must be zero. So for all $\lambda'$, eigenvalue of $A+P_{min}\cdot I$, there must be a $\lambda$, eigenvalue of A, such that $\lambda'=\lambda+P_{min}$ (and the other way around). This means that by adding a constant $P_{min}$ to the main diagonal of a matrix, all eigenvalues of that matrix are shifted by $P_{min}$). So we define:

$$P_{\alpha,\lim}^{S,L}[lA] = P_\alpha^{S,L}[lA] \frac{P_{\min}}{2\alpha} \cdot I^{S,L}$$

which results in $$P_{\alpha,\lim}^{S,L}[lA] = (1-\gamma)\cdot P_{\alpha,\lim}^{S,L}[(l-1)A] + \gamma \cdot$$
$$\left(\frac{1}{2\alpha L}\cdot (X^{S,L,L}[lA])^* \cdot (X^{S,L,L}[lA])^t + \frac{P_{\min}}{2\alpha}\cdot I^{S,L}\right).$$

This is shown in FIG. 9 of the drawings.

The effect of this shifting of the eigenvalues on the (theoretical ideal) convergence behavior of the algorithm will be very small, and in practice the algorithm is much more stable.

Although $P_{a,lim}^{S,L}[lA]$ is a sparse matrix, computing its inverse would still require L inversions of S×S matrices, which takes on the order of $L\cdot S^3$ operations. As we, however, do not need the inverse itself, but only its matrix-vector product with the input signals, we can also look at it as solving the system $$P_{\alpha,\lim}^{S,L}[lA]\cdot \begin{pmatrix} \underline{Y}_{S-1}^L[lA]^* \\ \vdots \\ \underline{Y}_1^L[lA]^* \\ \underline{Y}_0^L[lA]^* \end{pmatrix} = \begin{pmatrix} \underline{X}_{S-1}^L[lA]^* \\ \vdots \\ \underline{X}_1^L[lA]^* \\ \underline{X}_0^L[lA]^* \end{pmatrix}.$$

which requires on the order of $L\cdot S^2$ operations. Another option is to estimate the inverse of $P^{S,L}[lA]$ directly, which also results in a number of operations proportional to $L\cdot S^2$. However, also in this case, we have to limit the eigenvalues to assure stability.

A simple algorithm is given by:

$$(P^{S,L}[lA])^{-1} = (1+\gamma)\cdot (P^{S,L}[(l-1)A])^{-1} - \frac{\gamma}{L}Q^{S,L,L}[lA]\cdot (Q^{S,L,L}[lA])^h$$

with $$Q^{S,L,L}[lA] = \qquad (14)$$
$$(P^{S,L}[l-1A])^{-1}\begin{pmatrix} \underline{X}_{S-1}^L[lA]^* \\ \vdots \\ \underline{X}_1^L[lA]^* \\ \underline{X}_0^L[lA]^* \end{pmatrix} = (P^{S,L}[l-A])^{-1}\cdot (X^{S,L,L}[lA])^*$$

We can incorporate $\alpha$, which results in $$(P_\alpha^{S,L}[lA])^{-1} = (1+\gamma)\cdot (P_\alpha^{S,L}[(l-1)A])^{-1} - \frac{\gamma}{2\alpha L}Q^{S,L,L}[lA]\cdot (Q^{S,L,L}[lA])^h.$$

The above algorithm does not guarantee a matrix $(P_\alpha^{S,L}[lA])^{-1}$ with positive eigenvalues, and, therefore, introduces a lot of stability problems. In the single channel case, we are able to stabilize the algorithm by using a lower limit on the estimate, which automatically results in positive eigenvalues because the matrix is diagonal, but that is not possible in the multiple channel case.

Positive Eigenvalues

An exact transformation of an algorithm for estimating $P_a^{S,L}[lA]$ with positive eigenvalues will lead to an estimation algorithm for the inverse with positive eigenvalues. This can be done by using the matrix inversion lemma. When there is matrix A such that $$A=B+C\cdot D\cdot E \qquad (15)$$

then the inverse matrix $(A)^{-1}$ of A can be expressed by $$(A)^{-1}=(B)^{-1}-(B)^{-1}\cdot C\cdot ((D)^{-1}+E\cdot (B)^{-1}\cdot C)^{-1}\cdot E\cdot (B)^{-1}. \qquad (16)$$

By choosing $$A = P_\alpha^{S,L}[lA] \qquad (17)$$
$$B = (1-\gamma)\cdot P_\alpha^{S,L}[(l-1)A]$$
$$C = (X^{S,L,L}[lA])^*$$
$$D = \frac{\gamma}{2\alpha L}\cdot I^L$$
$$E = C^h = (X^{S,L,L}[lA])^t$$

and $$Q = (B)^{-1}\cdot C \qquad (18)$$
$$= E\cdot (B)^{-1}$$
$$= \frac{1}{1-\gamma}\cdot (P_\alpha^{S,L}[(l-1)A])^{-1}\cdot (X^{S,L,L}[lA])^*$$

we obtain by using Equation (14)

$$(P_\alpha^{S,L}[lA])^{-1} = \qquad (19)$$

-continued $$\frac{1}{1-\gamma}P_\alpha^{S\cdot L}[(l-1)A]^{-1} - Q^{S\cdot L,L}[lA]\cdot(\underline{\underline{D}}^L[lA])^{-1}\cdot(Q^{S\cdot L,L}[lA])^h$$

with $$\underline{\underline{D}}^L[lA] = \frac{2\alpha L}{\gamma}I^L + (X^{S\cdot L,L}[lA])^t\cdot Q^{S\cdot L,L}[lA]. \tag{20}$$

Equation (19) involves no matrix inversion, and only $L/2+1$ divisions, as the matrix $\underline{\underline{D}}^L[lA]$ of Equation (20) is a real valued diagonal matrix.

Limits on the Eigenvalues

An operation on the inverse power matrix that is equivalent to adding a constant to the diagonal of the (non-inverse) power matrix, would solve the problem. Adding a full $(S\cdot L)\times(S\cdot L)$ identity matrix and trying to find an equivalent operation on the inverse power matrix with the matrix inversion lemma, results in an algorithm that requires the matrix inversion we would like to avoid, so we try $$P_{\alpha,\text{lim}}^{S\cdot L}[lA] = (1-\gamma)\cdot P_{\alpha,\text{lim}}^{S\cdot L}[(l-1)A] + \frac{\gamma}{2\alpha L}\cdot\left(X_{\text{lim}}^{S\cdot L,L}[lA]\right)^*\cdot\left(X_{\text{lim}}^{S\cdot L,L}[lA]\right)^t \tag{21}$$

with $$(X_{lim}^{S\cdot L,L}[lA])^*\cdot(X_{lim}^{S\cdot L,L}[lA])^t = (X^{S\cdot L,L}[lA])^*\cdot(X^{S\cdot L,L}[lA])^t + P_{min}\cdot 2\alpha L\cdot I^{S\cdot L}. \tag{22}$$

As the matrix I has rank $S\cdot L$ and the product matrices $(X_{lim}^{S\cdot L,L}[lA])^*\cdot(X_{lim}^{S\cdot L,L}[lA])^t$ and $(X^{S\cdot L,L}[lA])^*\cdot(X^{S\cdot L,L}[lA])^t$ both have a rank of (at most) L, this is not possible for $S>1$. As we need the average of $(X^{S\cdot L,L}[lA])^*\cdot(X^{S\cdot L,L}[lA])^t$, we can find a solution by taking the average over S consecutive updates. We will try to find $X_{lim}^{S\cdot L,L}[lA]$ such that $$\varepsilon\left\{\sum_{a=0}^{S-1}\left(X_{\text{lim}}^{S\cdot L,L}[(l+a)A]\right)^*\cdot\left(X_{\text{lim}}^{S\cdot L,L}[(l+a)A]\right)^t\right\} \tag{23}$$

$$= \varepsilon\left\{\sum_{a=0}^{S-1}\left(X^{S\cdot L,L}[(l+a)A]\right)^*\cdot\left(X^{S\cdot L,L}[(l+a)A]\right)^t\right\} + P_{min}\cdot 2\alpha LS\cdot I^{S\cdot L}$$

with for $i=l \bmod S$ $$X_{\text{lim}}^{S\cdot L,L}[lA] = \begin{pmatrix}\underline{X}_{S-1}^L[lA] \\ \vdots \\ \underline{X}_1^L[lA] \\ \underline{X}_0^L[lA]\end{pmatrix} + \begin{pmatrix}u_{S-1,i}\cdot I^L \\ \vdots \\ u_{1,i}\cdot I^L \\ u_{0,i}\cdot I^L\end{pmatrix} \tag{24}$$

$$= X^{S\cdot L,L}[lA] + \begin{pmatrix}u_{S-1,i}\cdot I^L \\ \vdots \\ u_{1,i}\cdot I^L \\ u_{0,i}\cdot I^L\end{pmatrix}.$$

with $$U^S = \begin{pmatrix}u_{S-1,S-1} & \cdots & u_{S-1,1} & u_{S-1,0} \\ \vdots & & \vdots & \vdots \\ u_{1,S-1} & \cdots & u_{1,1} & u_{1,0} \\ u_{0,S-1} & \cdots & u_{0,1} & u_{0,0}\end{pmatrix}. \tag{25}$$

For $S=1$, we get $$U^1 = \sqrt{P_{min}\cdot 2\alpha L} \tag{26}$$

For $S>1$, there are an infinite number of solutions. If we try to keep the maximum distortion (the largest matrix element) as small as possible, we have to choose, for all $S>j\geq 0$ and $S>i\geq 0$ $$u_{j,i} = \pm\sqrt{P_{min}\cdot 2\alpha L}. \tag{27}$$

If there is a real symmetric matrix $U^L$ for $S=L$, then a real symmetric matrix $U^{2L}$ for $S=2L$ is given by $$U^{2L} = \begin{pmatrix}U^L & U^L \\ U^L & -U^L\end{pmatrix}. \tag{28}$$

Using the above equation, we can construct all $U^{2^i}$ with $i>0$. If $S+1$ is not a power of two, then we will use the matrix $U^{2^i}$ where $2^i>S+1>2^{i-1}$, and use the last S rows. In Table 1, the power matrix estimation algorithm using a direct inverse estimation with limits on the eigenvalues is summarized.

Initialization

1. $S_u = 2^{\lceil log_2 S+1 \rceil}$ $$U^1 = \sqrt{P_{min}\cdot 2\alpha L}$$

for $i=1$ to $\log_2(S_u)$ do 2. begin $$U^{2^i} = \begin{pmatrix}U^{2^{i-1}} & U^{2^{i-1}} \\ U^{2^{i-1}} & -U^{2^{i-1}}\end{pmatrix}$$

end

3. Initialize power matrix.

Iteration

1. $X_{\text{lim}}^{S\cdot L,L}[lA] = \begin{pmatrix}\underline{X}_{S-1}^L[lA] \\ \vdots \\ \underline{X}_1^L[lA] \\ \underline{X}_0^L[lA]\end{pmatrix} + \begin{pmatrix}u_{S_u-1,l\bmod S_u}\cdot I^L \\ \vdots \\ u_{S_u-S+1,l\bmod S_u}\cdot I^L \\ u_{S_u-S,l\bmod S_u}\cdot I^L\end{pmatrix}$ 2. $Q^{S\cdot L,L}[lA] = \frac{1}{1-\gamma}\cdot(P_{\alpha,\text{lim}}^{S\cdot L}[(l-1)A])^{-1}\cdot\left(X_{\text{lim}}^{S\cdot L,L}[lA]\right)^*$ 3. $\underline{\underline{D}}^L[lA] = \frac{2\alpha L}{\gamma}I^L + \left(X_{\text{lim}}^{S\cdot L,L}[lA]\right)^t\cdot Q^{S\cdot L,L}[lA]$ 4. Calculate $(\underline{D}^L[lA])^{-1}$ 5. $(P_{\alpha,\lim}^{S \cdot L}[lA])^{-1} =$ $$\frac{1}{1-\gamma}(P_{\alpha,\lim}^{S \cdot L}[(l-1)A])^{-1} - Q^{S \cdot L,l}[lA] \cdot (\underline{D}^L[lA])^{-1} \cdot (Q^{S \cdot L,L}[lA])^h$$

Table 1: Direct inverse power update with limits.

Note that the inverse of $P^{S \cdot L}$ [lA] is also a sparse matrix with the same structure, and we define $$(P_{\alpha,\lim}^{S \cdot L})^{-1} = \begin{pmatrix} \underline{T}_{S-1,S-1}^L[lA] & \cdots & \underline{T}_{S-1,1}^L[lA] & \underline{T}_0^L[lA] \\ \vdots & \ddots & \vdots & \vdots \\ \underline{T}_{1,S-1}^L[lA] & \cdots & \underline{T}_{1,1}^L[lA] & \underline{T}_{1,0}^L[lA] \\ \underline{T}_{0,S-1}^L[lA] & \cdots & \underline{T}_{0,1}^L[lA] & \underline{T}_{0,0}^L[lA] \end{pmatrix}$$

where for $0 \leq i < S$ and $0 \leq j < S$ $$\underline{T}_{i,j}^L[lA] = diag\{T_{i,j}^L[lA]\}.$$

Figure 5:
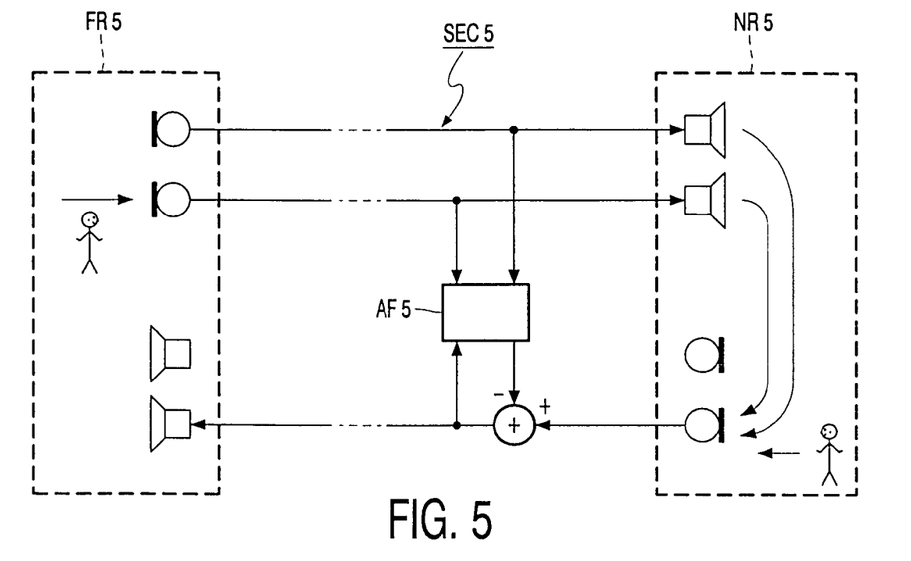
FIG. 5 shows a schematic example of a stereo echo cancellation in a teleconferencing system according to the invention.

FIG. 5 shows, schematically, an example of a teleconferencing system TS5 using a stereo echo canceller SEC5 with adaptive filters AF5 (only one shown). The teleconferencing system comprises a far room FR5 and a near room NR5. The adaptive filter AF5 has to filter the stereo echo signals.

Figure 6:
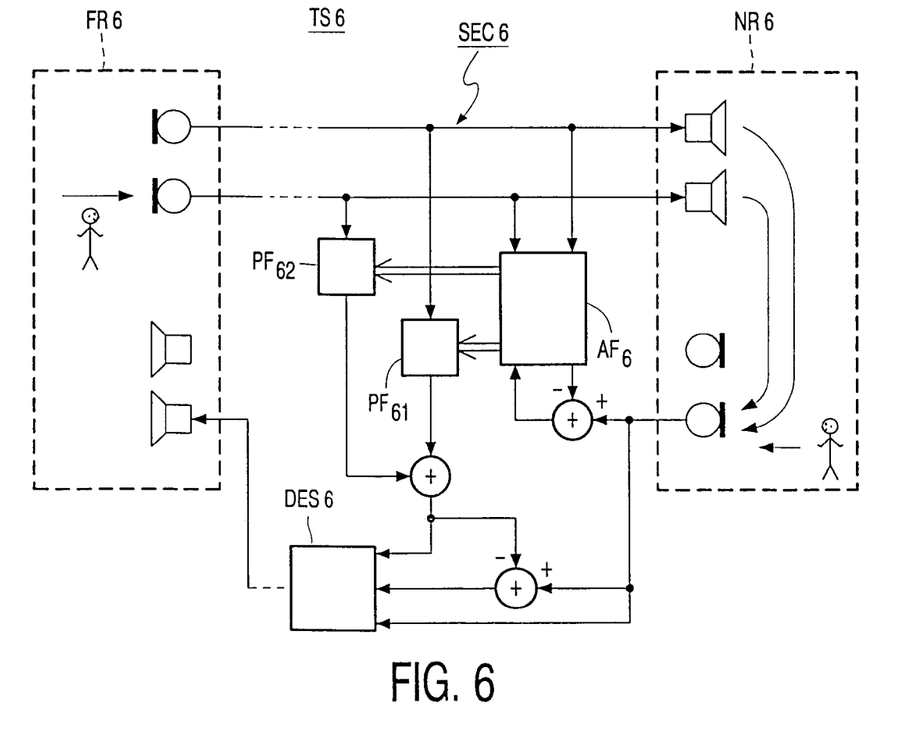
FIG. 6 shows a more detailed schematic example of a teleconferencing system according to the invention.

FIG. 6 shows an example of a stereo echo canceller SEC6 used in a teleconferencing system TS6. The stereo echo canceling has to be performed between the near room NR6 and the far room FR6. In this example, also programmable filters PF61 and PF62 are used to improve the performance of echo canceling. Programmable filters are described in U.S. Pat. No. 4,903,247.

Further, also the output of the programmable filters is supplied to a dynamic echo suppressor DES6, which is coupled with an output to the output of the stereo echo canceller. Dynamic echo suppressors are described in International Patent Application No. WO-97-45995, corresponding to U.S. Pat. No. 6,546,099.

A full stereo communication requires four stereo AECs, two on the near end side and two on the far end side. In FIG. 6, only one of these echo cancellers is depicted. Note that on each side we can combine the input signal delay-lines, the FFTs and the multiplication by the inverse power matrix of the two echo cancellers, which implies that the relative extra computational complexity for removing the cross-correlation is even further reduced. The performance of the AECs is further improved by adding Dynamic Echo Suppressors as shown.

Figure 7:
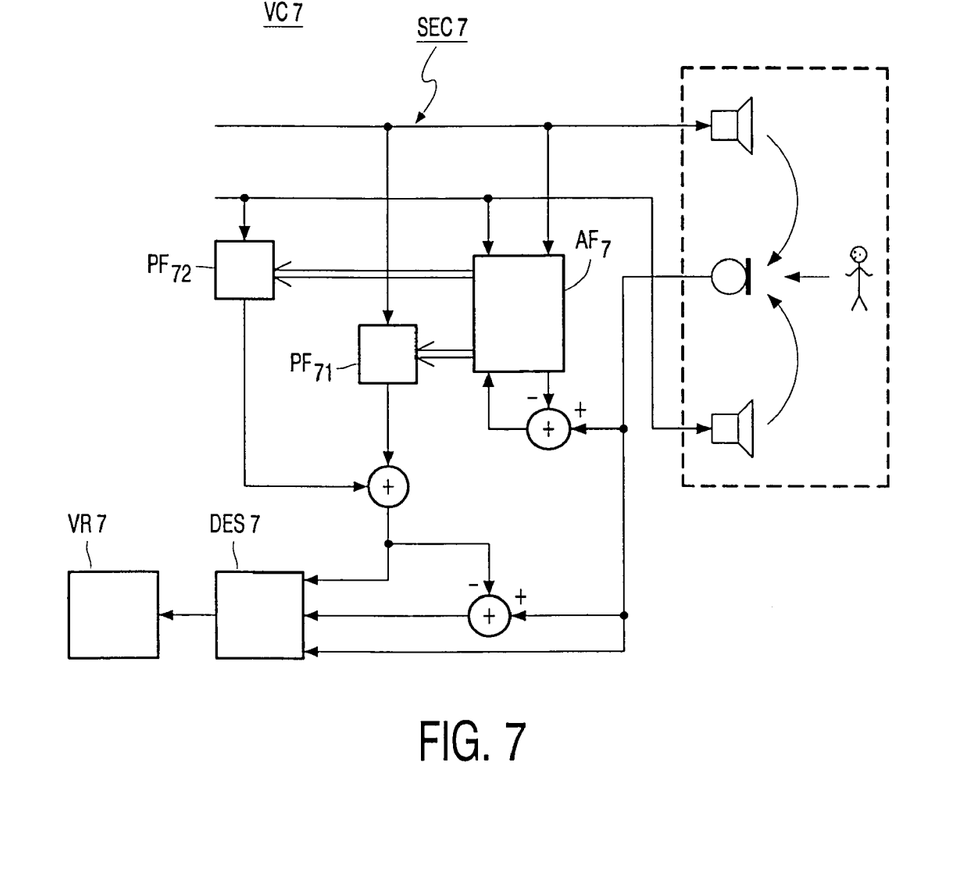
FIG. 7 shows a schematic example of a voice controlled device according to the invention.

FIG. 7 shows another application wherein a stereo echo canceller SEC7 is used in a voice-controlled audio (and video) system VCS7. To be able to recognize the local speaker by a voice recognition engine, we have to cancel the sound emitted by the audio set through the loudspeakers. This is done by using the stereo echo canceller SEC7. To improve the stereo echo canceling, also, in this example, the programmable filters PF71 and PF72 are used, and the Dynamic Echo Suppresser DES7 is used. The output of the Dynamic Echo Suppressor is coupled to a voice recognizer VR7 for handling the filtered signal.

Figure 8:
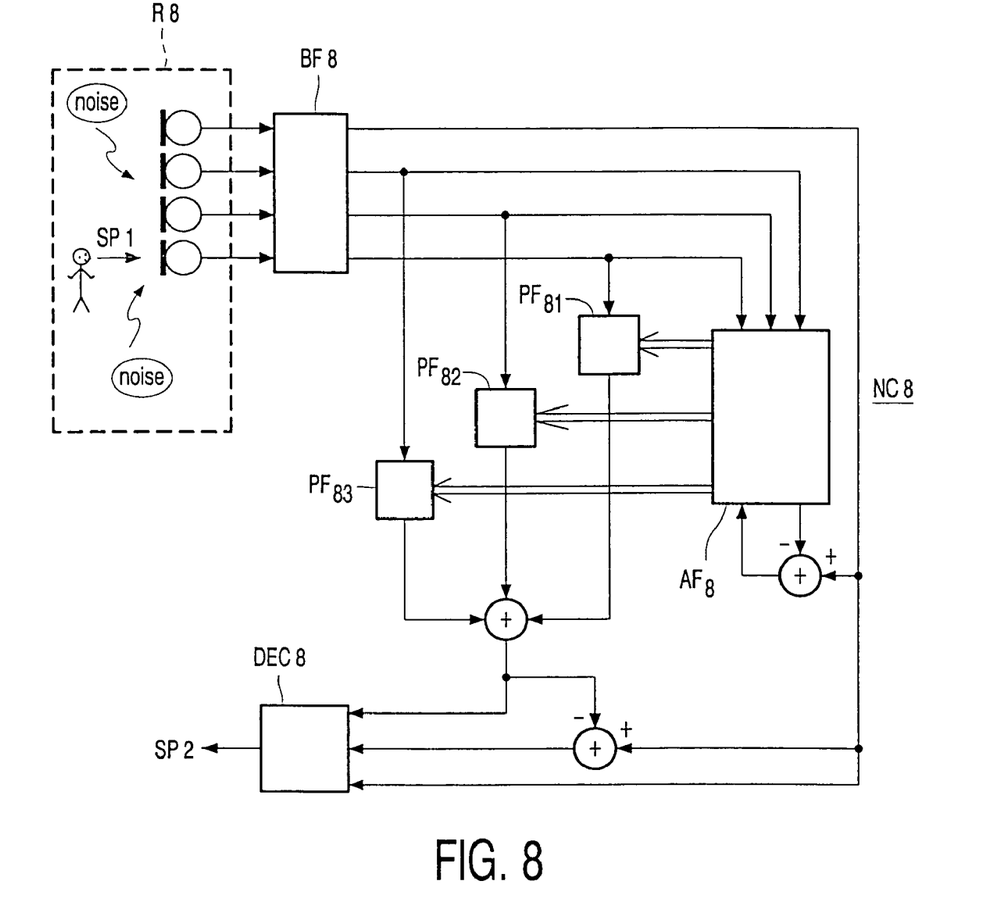
FIG. 8 shows a schematic example of a noise canceller according to the invention.

FIG. 8 shows an example of a noise canceller NC8 for canceling the noise received on microphones in a room R8 together with a speech signal sp1 from a person in the room. In this example, the microphones supply signals to a beam former BF8 which beam former supplies signals to the noise canceller NC8 and to programmable filters PF81, PF82 and PF83. Further the noise canceller comprises a dynamic echo suppressor DES8. The output of the Dynamic Echo Suppressor is coupled to the output of the noise suppressor to supply an estimate of the received speech sp2.

Also in the multiple input noise canceller, we can apply a DES (which is, in fact, not suppressing an echo, but is similar to the DES in the AEC's case) and programmable filters to improve performance, as shown in FIG. 8. An extra problem is that the inputs of the filters may contain some elements of the desired signal ("signal leakage"), because the beam former is not perfect. When the desired signal is speech signal, a speech detector can be used to improve the behavior of the MFDAF.

Above some examples of application of a stereo echo canceller and of a noise canceller are described. It is to be noted that the invention can be used in different applications and is not restricted to the described applications.

The invention claimed is:

1. An adaptive filter comprising at least two inputs for receiving at least two signals, and an output for supplying an output signal, characterized in that the adaptive filter further comprises:
    means for determining coefficient updates in a transformed domain, said transformed domain being the frequency domain;
    an update algorithm with transformed auto- and a cross correlation matrices; and
    means for reducing the effect of correlation between the input signals on the coefficient updates, said reducing means multiplying the frequency domain input signals with the inverse of the input channel's power matrix.

2. The adaptive filter as claimed in claim 1, characterized in that the update algorithm comprises solving a linear set of equations with the input channel power matrix as one of the elements of the linear set of equations.

3. A signal processing device comprising an adaptive filter as claimed in claim 1.

4. The signal processing device as claimed in claim 3, characterized in that the device further comprises a dynamic echo and noise suppressor as a post-processing device coupled to an output of the adaptive filter.

5. The signal processing device as claimed in claim 3, characterized in that the signal-processing device comprises a programmable filter.

6. A teleconferencing system comprising at least one signal-processing device as claimed in claim 3.

7. A voice-controlled electronic device comprising at least one signal-processing device as claimed in claim 3.

8. A noise cancellation system comprising at least one signal-processing device as claimed in claim 3.

9. An adaptive filter comprising at least two inputs for receiving at least two signals, and an output for supplying an output signal, characterized in that the adaptive filter further comprises:
    means for determining coefficient updates in a transformed domain, said transformed domain being the frequency domain;
    an update algorithm with transformed auto- and a cross correlation matrices; and
    means for reducing the effect of correlation between the input signals on the coefficient updates, said reducing means multiplying the frequency domain input signals with the inverse of the input channel's power matrix, characterized in that said adaptive filter comprises a first order recursive network for determining the input channel's power matrix, said first order recursive network receiving the product of the frequency domain input signals and their conjugates as input, and in that, at each iteration, a certain positive value is added to all elements of the main diagonal.

10. An adaptive filter comprising at least two inputs for receiving at least two signals, and an output for supplying an output signal, characterized in that the adaptive filter further comprises:
   means for determining coefficient updates in a transformed domain, said transformed domain being the frequency domain;
   an update algorithm with transformed auto- and a cross correlation matrices; and
   means for reducing the effect of correlation between the input signals on the coefficient updates, said reducing means multiplying the frequency domain input signals with the inverse of the input channel's power matrix, characterized in that the adaptive filter comprises means for directly estimating the inverse of the input channel's matrix using a recursive update algorithm, and in that a limit is imposed on the eigenvalues of the matrix.

11. A method for filtering at least two signals and for supplying an output signal, characterized in that the method comprises the steps:
   determining coefficient updates in the frequency domain;
   using an update algorithm with transformed auto- and a cross correlation matrices; and
   reducing the effect of correlation between the input signals on the coefficient updates by multiplying the frequency domain input signals with the inverse of the input channel's power matrix.

* * * * *